(12) United States Patent
Chiu et al.

(10) Patent No.: US 6,677,878 B2
(45) Date of Patent: Jan. 13, 2004

(54) APPARATUS AND METHOD FOR ANALOG SIGNAL PROCESSING FOR A MICROCONTROLLER

(75) Inventors: Yen-Chang Chiu, Taipei (TW); Chia-Shan Wei, Junghe (TW)

(73) Assignee: Elan Microelectronics Corporation, Hsin Chu (TW)

( * ) Notice: Subject to any disclaimer, the term of this patent is extended or adjusted under 35 U.S.C. 154(b) by 54 days.

(21) Appl. No.: 10/145,791

(22) Filed: May 16, 2002

(65) Prior Publication Data

US 2003/0214427 A1 Nov. 20, 2003

(51) Int. Cl.[7] .................................................. H03M 1/12
(52) U.S. Cl. ....................................................... 341/155
(58) Field of Search .................................. 341/155, 118, 341/120, 172, 161, 139

(56) References Cited

U.S. PATENT DOCUMENTS 6,567,029 B2 * 5/2003 Krymski et al. ............ 341/155

* cited by examiner

*Primary Examiner*—Brian Young
(74) *Attorney, Agent, or Firm*—Rosenberg, Klein & Lee (57) ABSTRACT

An analog signal processing apparatus generates a reference voltage for a microcontroller by utilization of interrupting the microcontroller when two similar analog sinusoidal signals with a phase difference cross over, and evaluating the positive and negative crossover voltages and their average as a temporary reference voltage that is evaluated for several times to avoid errors in the two analog input signals due to noise interference or voltage drift. Finally, the evaluated temporary reference voltages are averaged and set to be the reference voltage for the microcontroller.

29 Claims, 10 Drawing Sheets

APPARATUS AND METHOD FOR ANALOG SIGNAL PROCESSING FOR A MICROCONTROLLER

FIELD OF THE INVENTION

The present invention relates to an analog signal processing apparatus and method, and more specifically, to an analog signal processing apparatus and method for a reference voltage of a microcontroller to be dynamically adjustable so as to avoid errors resulted from noise interference or voltage drift in the input analog signals of the microcontroller.

BACKGROUND OF THE INVENTION

With the technology advancing, utilization of computer systems becomes more common. With regard to computer system user interface, to satisfy operation convenience, more and more computer system peripherals are developed to improve the performance of the computer systems and to provide user-friendly interface between users and the computer systems. Among currently computer system peripherals, such as computer system mouse, scanner, fax machine, bar-code reader, etc., are all products developed with application of photoelectronic technology, and one important characteristic of all these products is the conversion of input analog signals to digital signals by use of photoelectronic components and the subsequent process of the digital signals by microcontrollers to complete the task.

Figure 1:
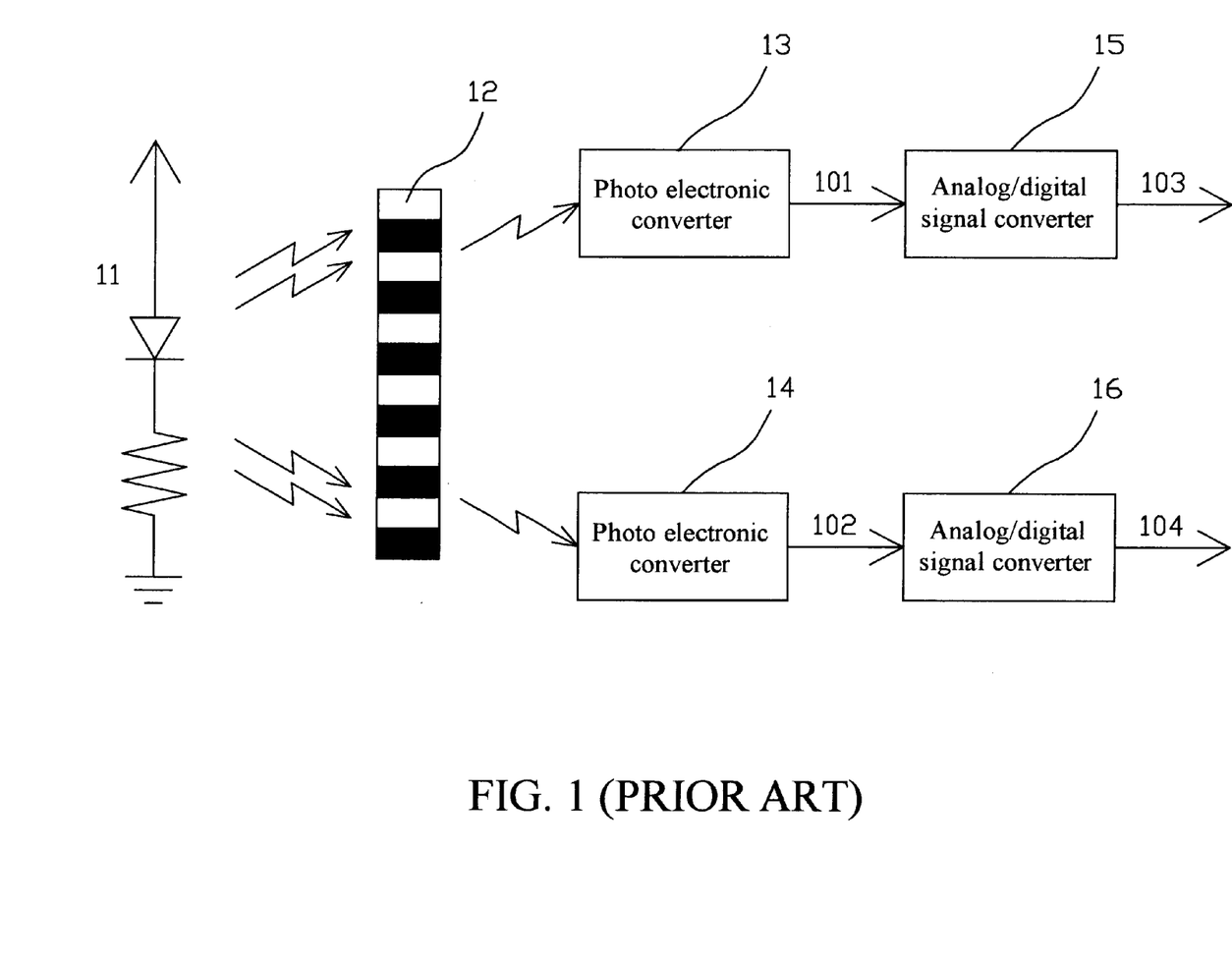
FIG. 1 is a schematic diagram of a known computer system mouse control apparatus.
Figure 2A:
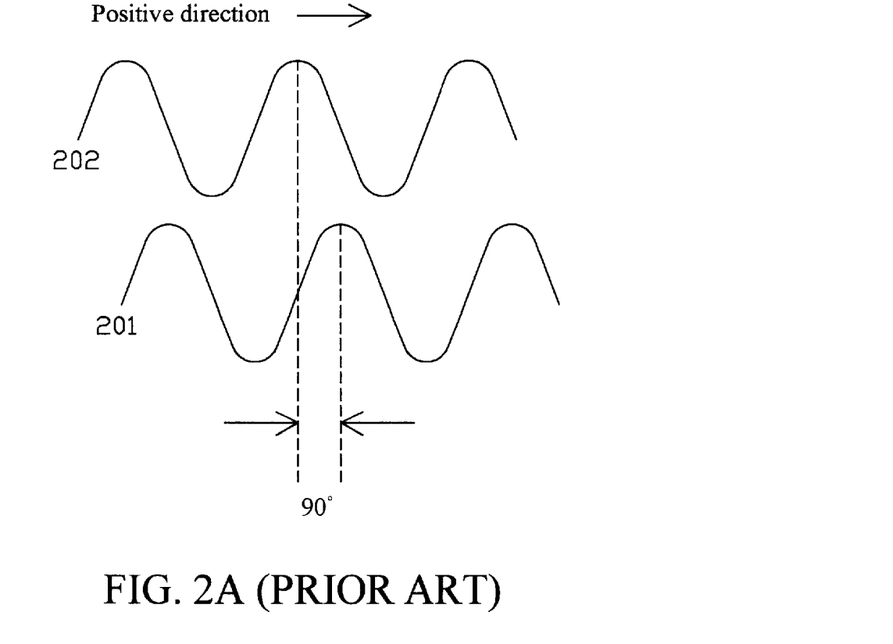
FIGS. 2A and 2B are the waveforms of input analog signals of a known computer system mouse.
Figure 2B:
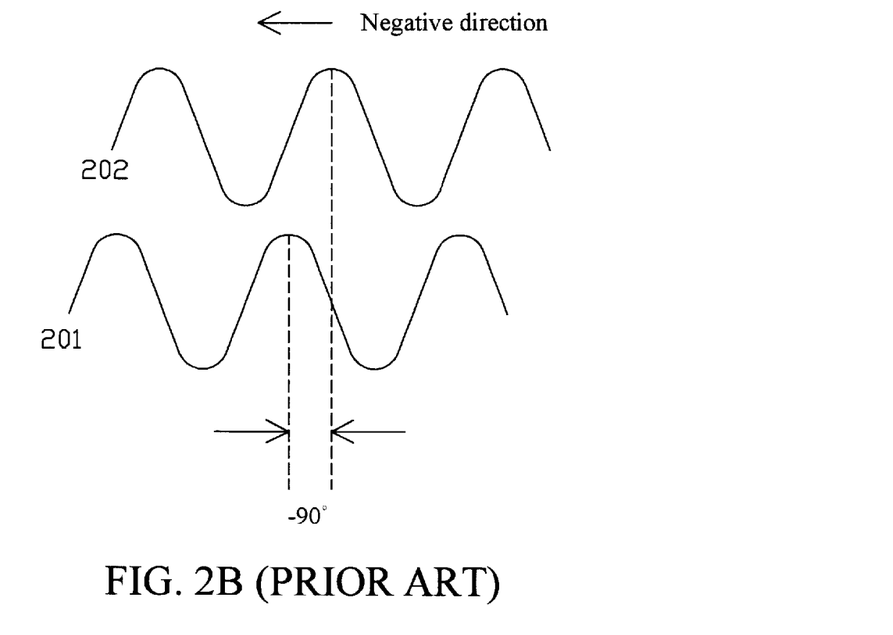

In a computer system mouse for instance, referring to FIG. 1, there is a known computer system mouse control apparatus including an LED 11, an optical grating 12, two sets of photoelectronic converters 13 and 14, and two sets of analog/digital signal converters 15 and 16. Its operation principle is that when the LED 11 emits light, light and dark interleaving light signals can be generated by the special shielding effect of the light grating 12 during the mouse moves, the light signals are transferred to the photoelectronic converters 13 and 14 each contains an photoelectronic transistor, and two similar analog sinusoidal signals 101 and 102 can be obtained by the photoelectronic conversion of the photoelectronic converters 13 and 14. Then the similar analog sinusoidal signals 101 and 102 are converted to two digital signals 103 and 104 by means of the analog/digital signal converter 15 and 16 and are outputted for processing by a microcontroller. Referring to FIGS. 2A and 2B, it is shown the waveforms of the known computer system mouse input signals with a phase difference of 90 degrees between the analog input signals 201 and 202. In case that the input signal 202 leads the signal 202, the direction of the mouse movement is defined as positive, as shown in FIG. 2A, otherwise as negative as shown in FIG. 2B.

Figure 3:
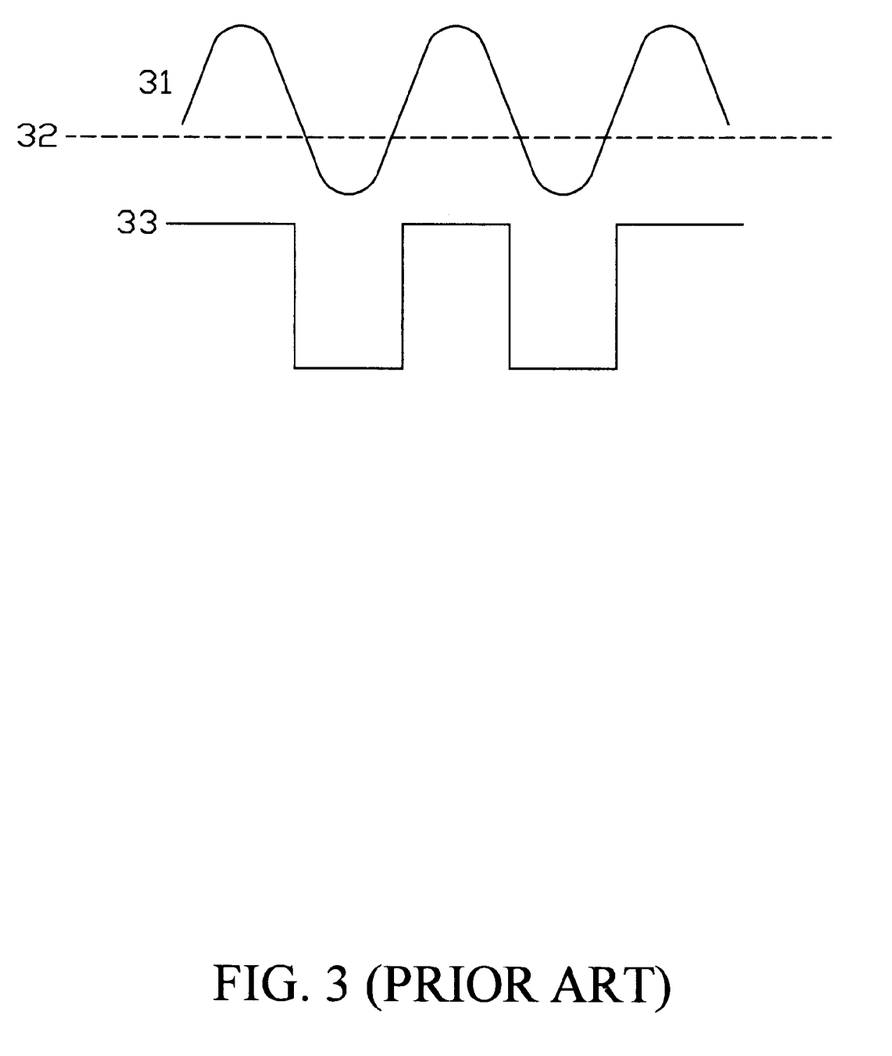
FIG. 3 is a diagram depicting the analog to digital signal conversion in a known computer system mouse.

Analog to digital signal converters 15 and 16 illustrated in FIG. 1 contain a reference voltage and a comparator to compare the input analog signals 101 and 102 with the reference voltage in turn. As shown in FIG. 3 for the diagram of a conventional analog to digital conversion in a mouse, in case an analog signal 31 is higher than a reference voltage 32, it is defined to be in the state "1" of a digital signal, otherwise in the state "0". With such comparison, a digital signal 33 can be obtained for subsequent processing for a microcontroller.

Figure 4A:
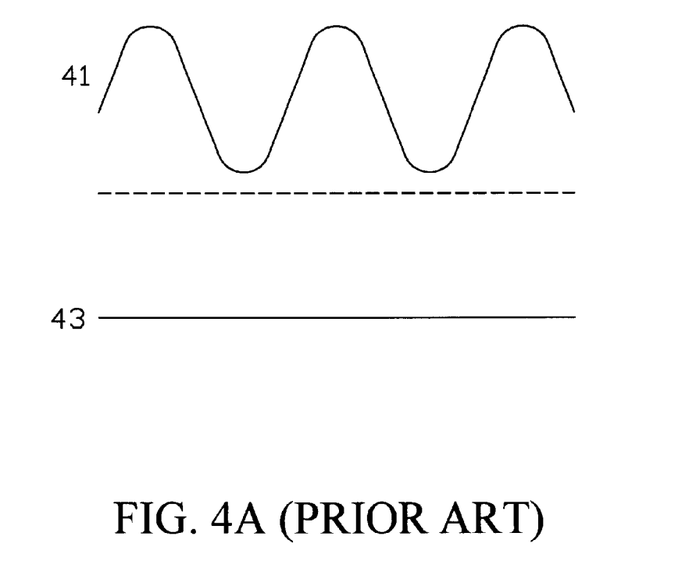
FIGS. 4A and 4B are diagrams depicting the analog to digital conversion when there are errors during the production process of a known computer system mouse.
Figure 4B:
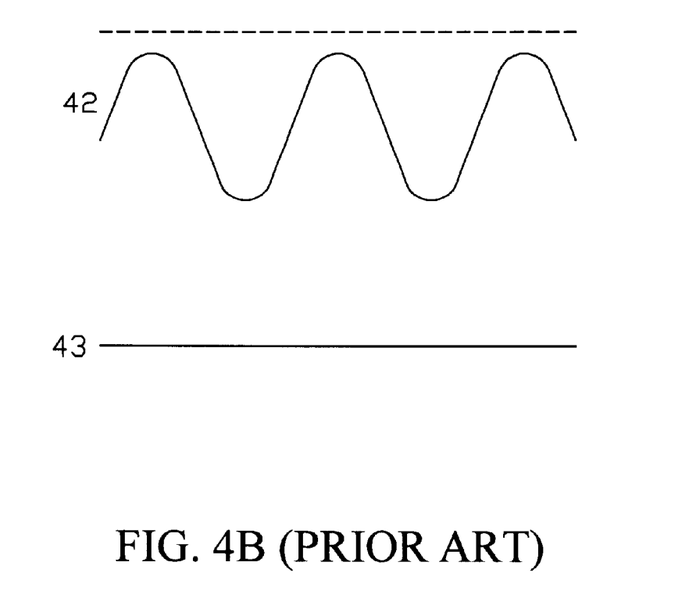

However, a few irritating problems exist during the design and production process of the computer system peripheral mentioned above. Again, in a computer system mouse for example, during the production process of the computer system mouse, the voltage drift of an input analog signal may result due to parameter errors in components, such as photoelectronic transistor, light emitting diode, optical grating, etc., or production errors such as component deviation, etc. Referring to FIGS. 4A and 4B, the influence of the above factors during design and production results in the phenomenon that the voltage of an input analog sinusoidal signal 41 is too high as shown in FIG. 4A, or the voltage of an input analog sinusoidal signal 42 is too low, as shown in FIG. 4B. However, since the reference voltage (shown in dotted lines) is fixed, abnormal digital output signals 43 and 44 are generated. Those errors do not result from the factors such as component malfunction or design deficiencies, while they may seriously affect the yield of production. To improve the situation, manufacturers have to select more precise components and purchase more precise equipments. In that case, even the production cost increases tremendously, the effects of improvement is very limited.

Therefore, with the insight into the errors in the conventional production process, it is developed an analog signal processing apparatus and method, by whice the reference voltage for a microcontroller applied in the computer system peripheral, such as computer system mouse, are designed to be dynamically adjustable to avoid errors due to signal noise interference or voltage drift in the input analog signals of the microcontroller.

SUMMARY OF THE INVENTION

One object of the present invention is to provide an apparatus for analog signal processing, which is used to avoid the errors due to signal noise interference or voltage drift in the input. analog signals of the microcontroller.

Another object of the present invention is to provide an apparatus for analog signal processing, which is used to dynamically adjust the reference voltage for a microcontroller to convert analog signals to digital signals.

Yet another object of the present invention is to provide a method for analog signal processing, which generates dynamically adjustable reference voltage for a microcontroller to convert input analog signals to digital signals.

According to the first aspect of a first preferred embodiment of the present invention, an analog signal processing apparatus for generating a reference voltage for a microcontroller comprises a first input apparatus for input of a first analog signal, a second input apparatus for input of a second analog signal, an interrupt generating apparatus to generate an interrupt signal when the first analog signal and the second analog signal cross over, a voltage level determination apparatus to generate a voltage level determination signal, a first crossover voltage latch apparatus to input the first analog signal and the voltage level determination signal and output a first crossover voltage latch signal, a second crossover voltage latch apparatus to input the second analog signal and the voltage level determination signal and output a second crossover voltage latch signal, a first storage apparatus to store the first crossover latch signal and feedback the first crossover voltage latch signal to the first input apparatus, and a second storage apparatus to store the second crossover voltage latch signal and feedback the second crossover latch voltage signal to the second input apparatus.

According to the design described above, the microcontroller is contained within a computer system peripheral such as a computer system mouse. The first and second analog signals are sinusoidal signals with a phase difference of 90 degrees there between. The interrupt generating apparatus comprises a difference signal generating apparatus to generate a difference signal of the first analog signal as well as the second analog signal, an edge trigger circuit to generate an edge trigger signal when the difference signal changes its state (i.e. when the two analog signals crossover), and an interrupt controller which corresponds the edge trigger signal to generate an interrupt to the microcontroller when the two analog signals cross over.

The aforementioned first crossover voltage latch apparatus, the second crossover voltage latch apparatus and the difference signal generating apparatus are implemented with a comparator, respectively, while the first and second storage apparatus are implemented with an I/O register, respectively. The voltage level determination apparatus comprises a programmable analog to digital controller and a control register used to output a fixed voltage as the voltage determination signal. Under the modulation by the control register, the programmable analog to digital controller can output multiple fixed voltages.

According to the second aspect of the first preferred embodiment of the present invention, a method for generating a reference voltage for a microcontroller comprises the following steps: (a) providing a first analog signal and a second analog signal with a phase difference there between, (b) generating an interrupt signal to the microcontroller when the first and second analog signal cross over, (c) evaluating a positive crossover voltage and a negative crossover voltage of the first and second analog signal, (d) returning to step (c) if the difference between the positive and negative crossover voltage is less than a predetermined voltage, and calculating an average of the positive and negative crossover voltage as a temporary reference voltage if the difference between the positive and negative crossover voltage is larger than or equal to a predetermined voltage, and (e) repeating steps (c) and (d) until the first and second analog signal are free from voltage drift and noise interference and calculating the average of the temporary reference voltages as a reference voltage of the microcontroller.

The first and second analog signals described above are sinusoidal signal, respectively, and the phase difference is 90 degrees. Preferably, the positive and negative crossover voltages are obtained by means of a binary search.

According to the first aspect of a second preferred embodiment of the present invention, an analog signal processing apparatus for generating a reference voltage for a microcontroller comprises a first input apparatus for input of a first analog signal, a second input apparatus for input of a second analog signal, a voltage level determination apparatus to generate a voltage level determination signal, a first crossover voltage latch apparatus to input the first analog signal and the voltage level determination signal and output a first crossover voltage latch signal, a second crossover voltage latch apparatus to input the second analog signal and the voltage level determination signal and output a second crossover voltage latch signal, a first storage apparatus to store the first crossover voltage signal, and a second storage apparatus to store the second crossover voltage signal.

According to the design described above, the microcontroller is contained within a computer system peripheral such as a computer system mouse. The first and second analog signals are sinusoidal signal with a phase difference of 90 degrees there between.

The aforementioned first crossover voltage latch apparatus, the second crossover voltage latch apparatus are implemented with a comparator, respectively, while the first and second storage apparatus are implemented with an I/O register, respectively. The voltage level determination apparatus comprises a programmable analog to digital controller and a control register, and is used to output a fixed voltage as the voltage level determination signal. Under the modulation by the control register, the programmable analog to digital controller can output multiple fixed voltages.

According to the second aspect of the second preferred embodiment of the present invention, a method for generating a reference voltage for a microcontroller comprises the following steps: (a) providing a first analog signal and a second analog signal with a phase difference there between, (b) setting a sampling interval, (c) sampling the first and second analog signal to obtain voltages of the first and second analog signal at a first sampling point and voltages of the first and second analog signal at a second sampling point, (d) comparing the voltage of the first analog signal with the voltage of the second analog signal at the first sampling point and comparing the voltage of the first analog signal and the voltage of the second analog signal at the second sampling point, (e), calculating the average of the first analog signal voltage and the second analog signal voltage at the first sampling point or the average of the first analog signal voltage and the second analog signal voltage at the second sampling point as a first crossover voltage of the first and second analog signal if the comparison result of the voltage of the first analog signal with the voltage of the second analog signal at the first sampling point is different from that of the voltage of the first analog signal with the voltage of the second analog signal at the second sampling point, (f) repeating steps (c) to (e) to obtain a second crossover voltage which is different from the first crossover voltage and calculating the average of the first and second crossover voltage as a temporary reference voltage, and (g) repeating step (f) until the first and second analog signal are free from voltage drift and noise interference and calculating the average of the temporary reference voltages as a reference voltage for the microcontroller.

According to the design described above, the first and second analog signals are sinusoidal signal, respectively, and the phase difference is 90 degrees.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 5:
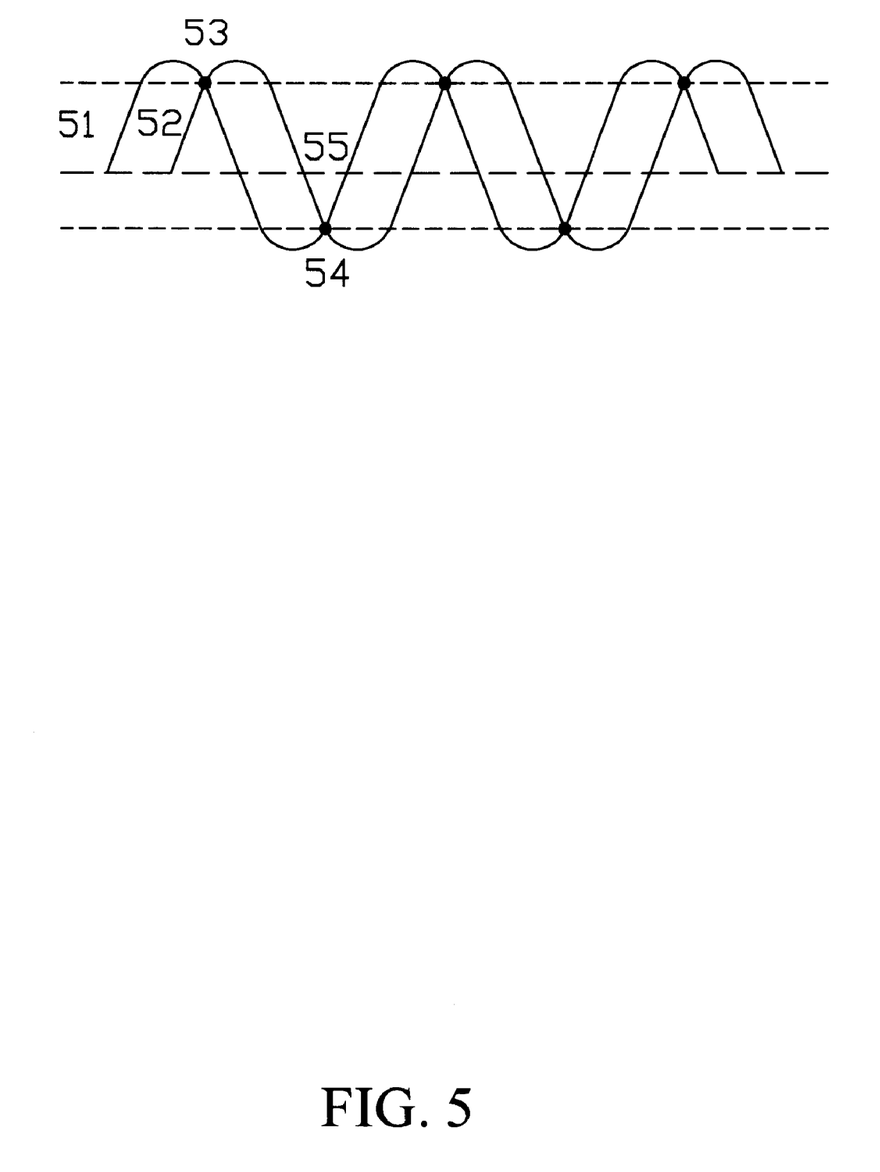
FIG. 5 is a diagram depicting the principle of the present invention.

The present invention is based on the principle that when two analog sinusoidal signals have a phase difference, the two analog sinusoidal signals will generate two separate crossover points at a wavelength interval due to the phase difference. As shown in FIG. 5, the phase difference between two analog sinusoidal signals 51 and 52 is 90 degrees, and there are a maximum crossover point 53 and a minimum crossover point 54. The principle of the present invention is to take average 55 of the maximum and minimum crossover voltages between the two similar analog sinusoidal signals with a phase difference and then use the average 55 as the reference voltage, so that the reference voltage can be adjusted automatically corresponding to the input voltages and avoid the errors resulted from the input analog signal noise interference or voltage drift in the known process.

Figure 6:
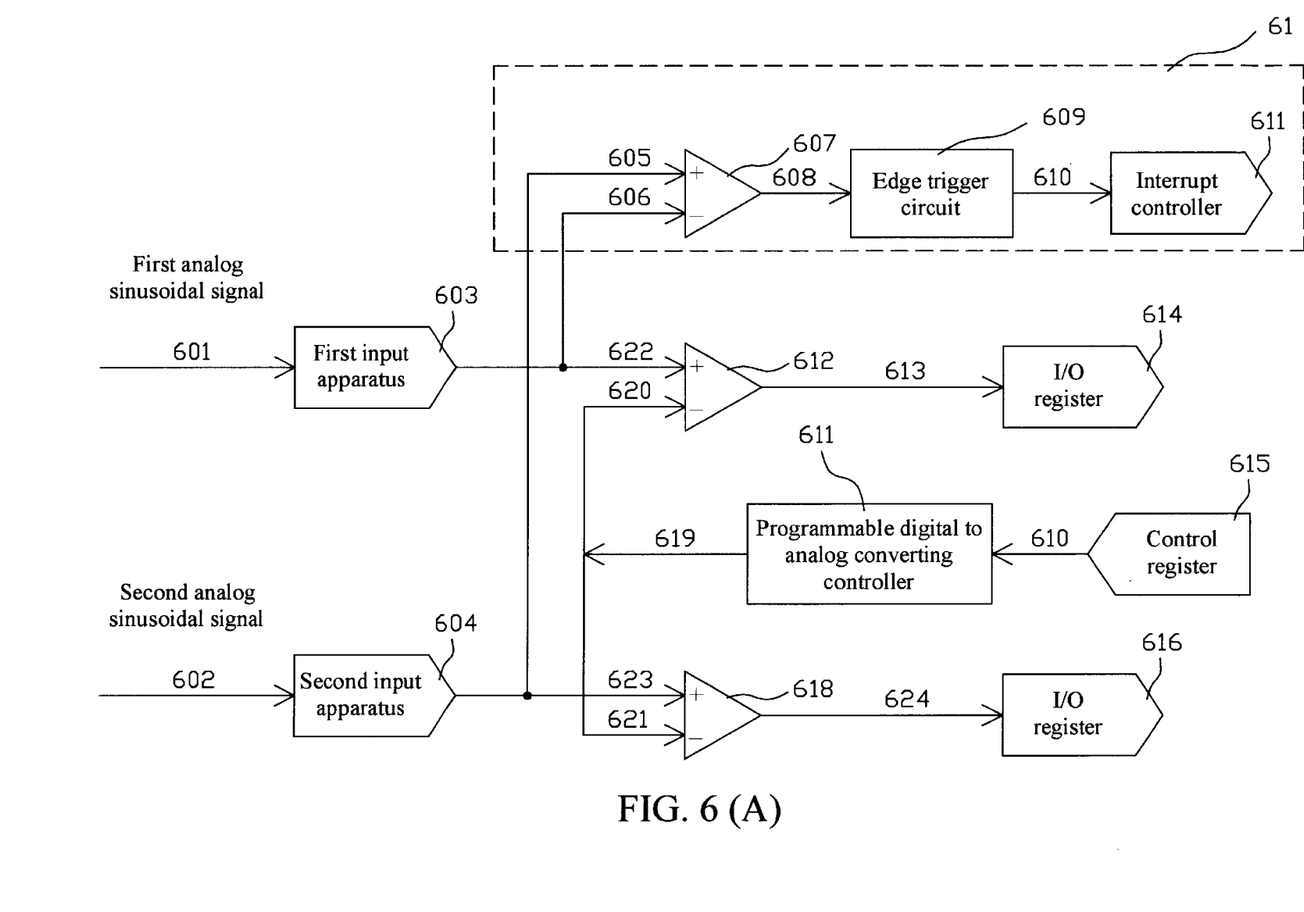
FIG. 6A is a circuit block diagram of a first preferred embodiment analog signal processing apparatus of a microcontroller according to the present invention.
FIG. 6B is the clock waveforms on the nodes of the FIG. 6A.

Referring to FIG. 6A and FIG. 6B, which is a circuit block diagram of a first preferred embodiment analog signal processing apparatus of a microcontroller according to the present invention and the waveforms on the nodes in FIG. 6A, respectively. There is a 90 degree phase difference between the first analog sinusoidal signal 601 and the second analog sinusoidal signal 602 inputted to the microcontroller, as shown in FIG. 6, and the first analog sinusoidal signal 601 is inputted to the first input apparatus 603 while the second analog sinusoidal signal 601 is inputted to the second input apparatus 604. For the microcontroller to detect when the first analog sinusoidal signal 601 and the second analog sinusoidal signal 602 cross over, the analog signal processing apparatus provides an interrupt generating apparatus 61 to produce an interrupt signal when the first analog sinusoidal signal 601 and the second analog sinusoidal signal 602 cross over. The interrupt generating apparatus 61 comprises a difference signal generating apparatus 607 (a comparator in the present embodiment), which takes the first analog sinusoidal signal 601 and the second analog sinusoidal signal 602 as inputs and generates a digital difference signal 608 between the two analog sinusoidal signals 601 and 602, the waveform is shown in FIG. 6B. The interrupt generating apparatus 61 also comprises an edge trigger circuit 609 to take a digital signal 608 as input and produce an edge trigger signal as shown in FIG. 6B. It is obviously in FIG. 6B that the digital signal 608 is the difference signal between the first analog sinusoidal signal 601 and the second analog sinusoidal signal 602, and the edge of its digital state change is where the first analog sinusoidal signal 601 and the second analog sinusoidal signal 602 cross over, thus the edge trigger signal 610 is generated at the crossover point of the first analog sinusoidal signal 601 and the second analog sinusoidal signal 602. The interrupt generating apparatus 61 further comprises an interrupt controller 611 to interrupt the microcontroller responsive to the edge trigger signal 610. Therefore, the microcontroller will be informed once the first analog sinusoidal signal 601 and the second analog sinusoidal signal 602 cross over.

When the microcontroller is interrupted, a voltage level determination apparatus comprising a control register 615 and a programmable digital to analog converting controller 611 can provide a voltage level determination signal 619 to regulate the input voltage level of the first analog sinusoidal signal 601 and the second analog sinusoidal signal 602. The programmable digital to analog converting controller 611 is modulated by the control register 615 to output a fixed voltage 619 as a voltage level determination signal and the voltage resolution of the output fixed voltage is determined by the bit size of the control register 615. For instance, if the length of the control register 615 is 5 bits, the control register 615 can control the programmable digital to analog converting controller 611 to output 32 different levels of fixed voltage.

A crossover voltage calculation process is initiated when the voltage level determination signal 619 is inputted to the first crossover voltage latch apparatus 612 and the second crossover voltage latch apparatus 618 (in the present embodiment it is a comparator). The method for crossover voltage calculation is to find out the crossover voltage of the first analog sinusoidal signal 601 and the second analog sinusoidal signal 602 by means of binary search. For instance, if the length of the control register 615 is 5 bits, the programmable digital to analog converting controller 611can output 32 different levels of fixed voltage, and the program can find out the crossover voltage in at most five iterations if a binary search method is adopted. When the voltage level determination signal 619 is inputted to the input port 620 of the first crossover voltage latch apparatus 612 and compared with the first analog sinusoidal signal 601 inputted to the other input port 622 of the first crossover voltage latch apparatus 612, a first crossover voltage latch signal 613 will be generated. The first crossover voltage latch signal 613 is the difference signal of the first analog sinusoidal signal 601 and the voltage level determination signal 619 and it is a binary value (0 or 1). The operation of the second crossover voltage latch apparatus 618 and voltage level determination signal 619 have the same principle as that of the aforementioned second crossover voltage latch apparatus 612 and voltage level determination signal 619 except that the second crossover voltage latch apparatus 618 and the voltage level determination signal 619 generate a second crossover latch signal 624 to search for the negative crossover voltage of the other crossover point in the same wavelength interval, so it is not described again here.

Figure 7:
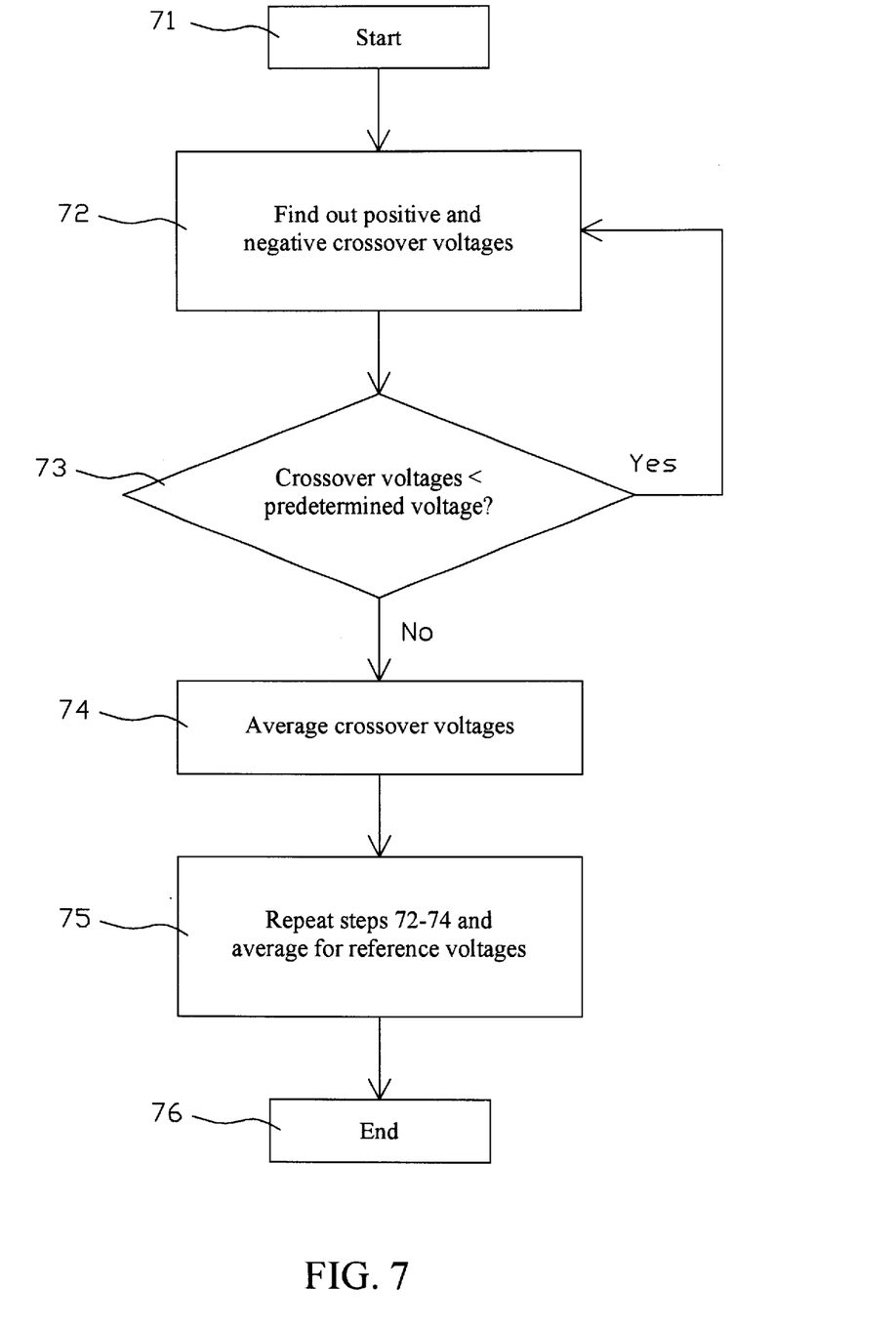
FIG. 7 is a flow chart of the first preferred embodiment analog signal processing method of a microcontroller according to the present invention.

The first crossover voltage lock signal 613 is stored in the first storage apparatus 614 (in the present embodiment, both the first storage unit 614 and the second storage unit 616 are an I/O register respectively), serving as an input for the first input apparatus 603. The second crossover voltage latch signal 624 is stored in the second storage apparatus 616, serving as an input for the second input apparatus 604. By means of the binary search algorithm in the program, the positive crossover voltage and the negative crossover voltage of the first analog sinusoidal signal 601 and the second analog sinusoidal signal 601 can be found. FIG. 7 shows the flow chart of the digital signal processing method by the microcontroller of the first preferred embodiment. In step 72, the positive crossover voltage and the negative crossover voltage are found out. In decision-making step 73, the program will decide if the difference of the positive crossover voltage and the negative crossover voltage calculated is less than a predetermined value. If so, then the previously calculated positive crossover voltage and the negative crossover voltage will be discarded and it will star searching for a new positive crossover voltage and negative crossover voltage again. Otherwise, step 74 will calculate the average of the new positive crossover voltage and negative crossover voltage and take the average as the temporary reference voltage of the microcontroller. To avoid errors due to noise interference or voltage drift, it is necessary to repeat steps 72 to 74 for several times until there is no noise interference or voltage drift in the two analog sinusoidal signals, and the average of the evaluated temporary reference voltages is taken as the reference voltage for the microcontroller.

Figure 8:
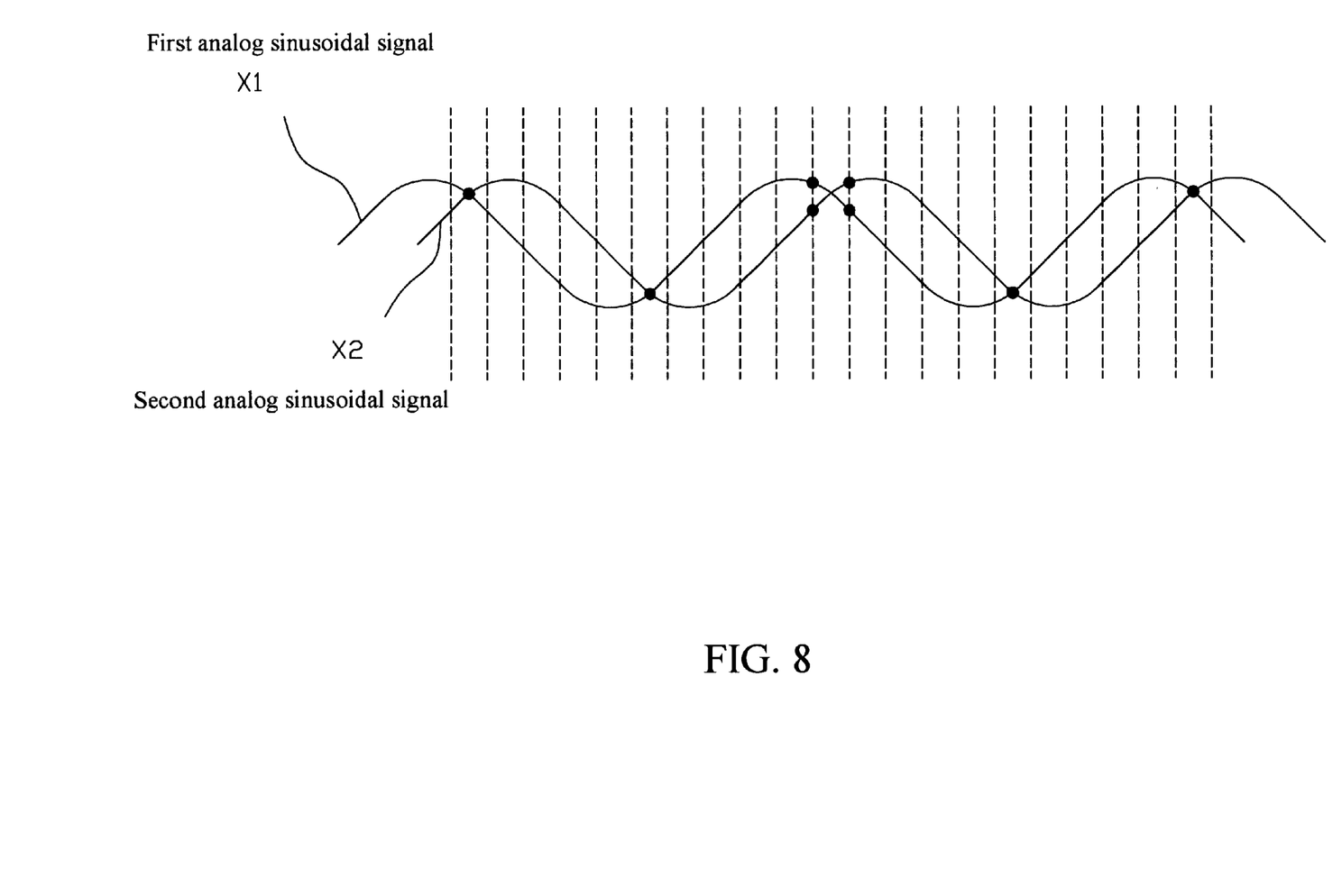
FIG. 8 is a diagram depicting sampling two analog signals in a second preferred embodiment analog signal processing apparatus of a microcontroller according to the present invention.
Figure 9:
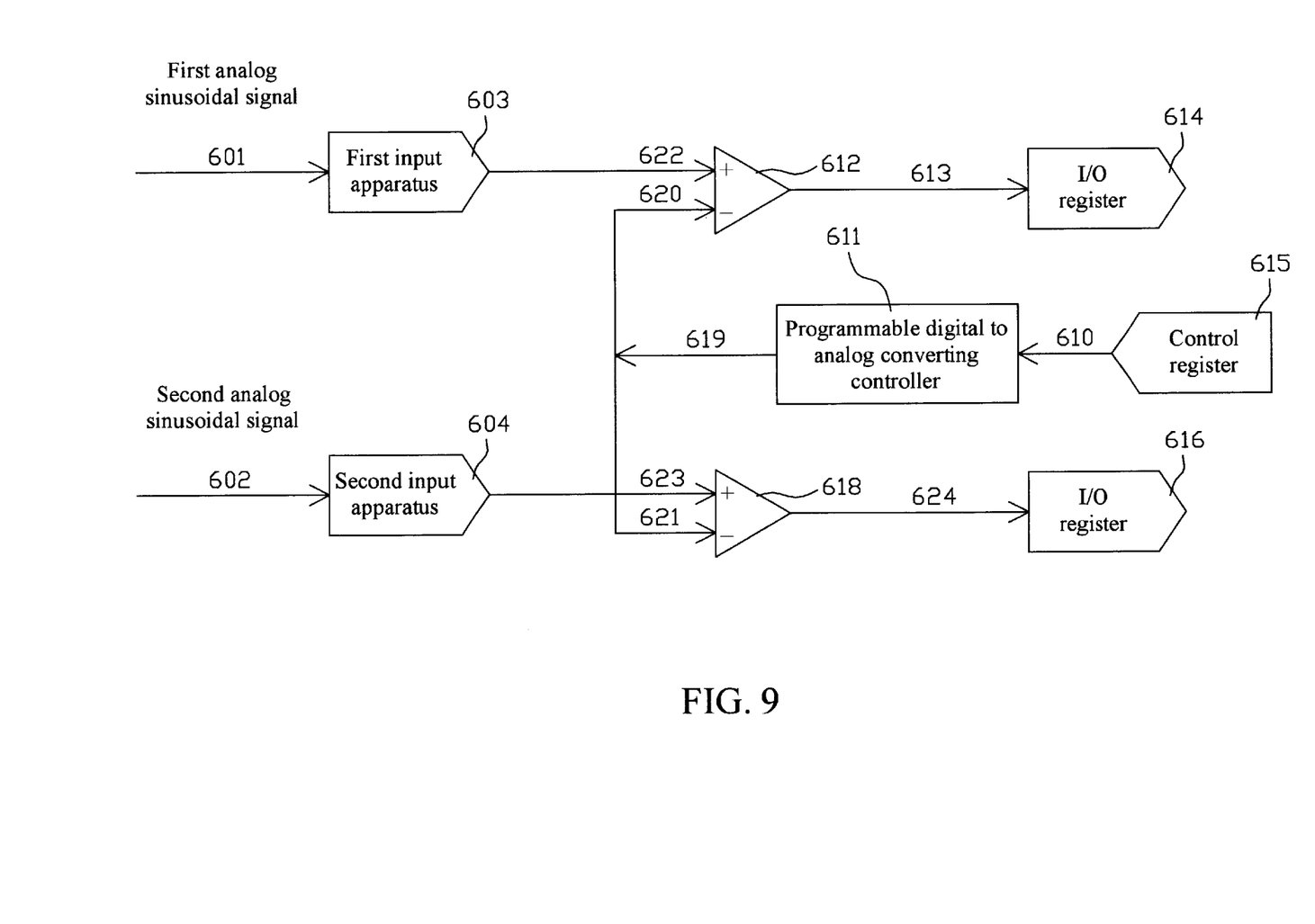
FIG. 9 is a circuit block diagram of the second preferred embodiment analog signal processing apparatus of a microcontroller according to the present invention.

FIGS. 8 and 9 show diagrams depicting the analog signal processing apparatus and method of a second preferred embodiment according to the present invention. The basic operation principle and apparatus are similar to the embodiment mentioned above, only that its processing procedure is easier than that of the embodiment described above and its circuit architecture is simpler than that of the embodiment mentioned above. Referring to FIG. 8 first, to find out the positive crossover voltage and negative crossover voltage of two similar analog sinusoidal signals X1 and X2, it is performed sampling the two similar analog sinusoidal signals X1 and X2 to determine the position of the crossover point. A sampling interval is t set in advance. If the samples are taken from the first analog sinusoidal signal X1 and second analog sinusoidal signal X2 each sampling interval, and it is assumed the sample taken before a certain crossover point is the N-th sample, and the sample taken after a certain crossover point is the (N+1)-th sample. The sampled voltage of the first analog sinusoidal signal at the N-th sample is A1 and the sampled voltage of the second analog sinusoidal signal is B1, and the sampled voltage of the first analog sinusoidal signal at the (N+1)-th sample is A2 and the sampled voltage of the second analog sinusoidal signal is B2. If the sampling interval is very small, (A1+A2)/2 can be regarded as a crossover voltage. Therefore, it can be found in FIG. 8 that the value of (A1+A2)/2 is between B1 and B2, in other words, the crossover point will occur between B1 and B2.

Thus, if the waveforms are sampled in a sampling interval that is very small compared to the period of the two similar analog sinusoidal signals, and the two consecutive sampled voltages of the two analog sinusoidal signals are X1(t1), X2(t1), X1(t2) and X2(t2), then when (a) X1(t1)>X2(t1) and X1(t2)<X2(t2), or (b) X1(t1)<X2(t1) and X1(t2)>X2(t2), the analog sinusoidal signals X1 and X2 definitely have a crossover between t1 and t2. According to the conclusion, the voltage of the crossover point between the two analog sinusoidal signals X1 and X2 can be evaluated. When the samples are taken from the two analog sinusoidal signals, if the comparison result of the two analog sinusoidal signals at this sampling point is different from that of the two analog sinusoidal signals at the next sampling point, the crossover voltage is the average of the two analog sinusoidal signals at this sampling point or the average of the two analog sinusoidal signals at the next sampling point. By the same token, the positive crossover voltage and negative crossover voltage of the two analog sinusoidal signals X1 and X2 can be evaluated, and their average is taken as a temporary reference voltage. Evaluating the temporary reference voltage for several times to get rid of the errors due to noise interference and voltage drift and the temporary reference voltages are averaged to be the reference voltage for the microcontroller.

FIG. 9 shows the circuit block diagram of an apparatus accomplishing the aforementioned analog signal processing method. Comparing FIG. 9 with FIG. 6A, it can be shown that FIG. 9 can be obtained by removing the interrupt-generating apparatus 61 in FIG. 6A. It is used a voltage level determination apparatus comprising a control register 615 and a programmable digital to analog converting controller to regulate the voltage of the first analog sinusoidal signal 601 and the second analog sinusoidal signal 602, and sampling the first analog sinusoidal signal 601 and the second analog sinusoidal signal 602 in a predetermined interval. If either of the conditions (a) and (b) is true, calculate the crossover voltage of the first analog sinusoidal signal 601 and the second analog sinusoidal signal 602. By the same token, two different crossover voltages can be averaged as the temporary reference voltage. By calculating the temporary reference voltage for several times, the errors due to noise interference and voltage drift can be eliminated, and average of the temporary reference voltages is taken as the reference voltage for the microcontroller.

In summary, the present invention comprises two sets of apparatus and methods for analog signal processing by a microcontroller. The first set makes use of generating interrupt when the two analog signals crossover, evaluating the positive crossover voltage and negative crossover voltage and then averaging them as the reference voltage for the microcontroller. The second set makes use of sampling the two analog signals in a very small sampling interval, if the comparison result of the two analog sinusoidal signals at this sampling point is different from that of the two analog sinusoidal signals at the next sampling point, the crossover voltage is the average of the two analog sinusoidal signals at this sampling point or the average of the two analog sinusoidal signals at the next sampling point. In this way another different crossover voltage can be obtained and the average of them is set to be the reference voltage for the microcontroller.

Conclusively, the analog digital processing according to the present invention takes advantage of a simple as well as easy circuit architecture to accomplish the design of dynamically adjusting the reference voltage for a microcontroller such that the reference voltage for the microcontroller can be adjusted responsive to the change of the two analog signal voltages, solving the errors due to the noise interference and voltage drift in the prior art, and increasing the yield of computer system peripheral such as computer system mouse.

What is claimed is:

1. An analog signal processing apparatus for generating a reference voltage for a microcontroller, comprises:

a first input apparatus for inputting a first analog signal;

a second input apparatus for inputting a second analog signal;

an interrupt generating apparatus for generating an interrupt signal when the first analog signal and the second analog signal cross over;

a voltage level determination apparatus for generating a voltage level determination signal;

a first crossover voltage latch apparatus for input the first analog signal and the voltage level determination signal and outputting a first crossover voltage latch signal;

a second crossover voltage latch apparatus for inputting the second analog signal and the voltage level determination signal and outputting a second crossover voltage latch signal;

a first storage apparatus for storing the first crossover voltage latch signal and feeding back the first crossover voltage latch signal to the first input apparatus; and a second storage apparatus for storing the second crossover voltage lock signal and feeding back the second crossover voltage lock signal to the second input apparatus.

2. An analog signal processing apparatus according to claim 1, wherein the first analog signal and the second analog signal are sinusoidal signal with a phase difference there between.

3. An analog signal processing apparatus according to claim 2, wherein the phase difference is 90 degrees.

4. An analog signal processing apparatus according to claim 1, wherein the interrupt generating apparatus comprises:
- a difference signal generating apparatus for generating a difference signal between the first analog signal and the second analog signal;
- an edge trigger circuit for generating an edge trigger signal when the difference signal changes a state; and
- an interrupt controller responsive to the edge trigger signal for, interrupting the microcontroller when the two analog signals cross over.

5. An analog signal processing apparatus according to claim 1, wherein the first crossover voltage latch apparatus, the second crossover voltage latch apparatus and the difference signal generating apparatus are implemented with a comparator, respectively.

6. An analog signal processing apparatus according to claim 1, wherein the voltage level determination apparatus comprises a programmable analog to digital converting controller and a control register for outputting a fixed voltage as the voltage level determination signal.

7. An analog signal processing apparatus according to claim 6, wherein the programmable analog to digital converting controller can output multiple fixed voltages under a modulation by the control register.

8. An analog signal processing apparatus according to claim 6, wherein the first storage apparatus and the second storage apparatus are implemented with an I/O register, respectively.

9. An analog signal processing apparatus according to claim 1, wherein the microcontroller is contained within a computer system peripheral apparatus.

10. An analog signal processing apparatus according to claim 9, wherein the computer system peripheral is a computer system mouse.

11. An analog signal processing apparatus for generating a reference voltage for a microcontroller, comprises:
- a first input apparatus for inputting a first analog signal;
- a second input apparatus for inputting a second analog signal;
- a voltage level determination apparatus for generating a voltage level determination signal;
- a first crossover voltage latch apparatus for inputting the first analog signal and the voltage level determination signal and outputting a first crossover voltage latch signal;
- a second crossover voltage latch apparatus for inputting the second analog signal and the voltage latch determination signal and outputting a second crossover voltage latch signal;
- a first storage apparatus for storing the first crossover voltage latch signal and feeding back the first crossover voltage latch signal to the first input apparatus; and
- a second storage apparatus for storing the second crossover voltage latch signal and feeding back the second crossover voltage latch signal to the second input apparatus.

12. An analog signal processing apparatus according to claim 11, wherein the first analog signal and the second analog signal are sinusoidal signal with a phase difference there between.

13. An analog signal processing apparatus according to claim 12, wherein the phase difference is 90 degrees.

14. An analog signal processing apparatus according to claim 11, wherein the first crossover voltage latch apparatus, the second crossover voltage latch apparatus and the difference signal generating apparatus are implemented with a comparator, respectively.

15. An analog signal processing apparatus according to claim 11, wherein the voltage level determination apparatus comprises a programmable analog to digital converting controller and a control register for outputting a fixed voltage for the voltage level determination signal.

16. An analog signal processing apparatus according to claim 15, wherein the programmable analog to digital converting controller can output multiple fixed voltages under a modulation by the control register.

17. An analog signal processing apparatus according to claim 11, wherein the first storage apparatus and the second storage apparatus are implemented with an I/O register, respectively.

18. An analog signal processing apparatus according to claim 11, wherein the microcontroller is contained within a computer system peripheral.

19. An analog signal processing apparatus according to claim 18, wherein the computer system peripheral is a computer system mouse.

20. An analog signal processing method for generating a reference voltage for a microcontroller, comprising the steps of:
- (a) providing a first analog signal and a second analog signal with a phase difference there between;
- (b) generating an interrupt signal to the microcontroller when the first analog signal and the second analog signal cross over;
- (c) evaluating a positive crossover voltage and a negative crossover voltage of the first analog signal and the second analog signal;
- (d) returning to step (c) if a difference between the positive crossover voltage and the negative crossover voltage is less than a predetermined voltage, and calculating an average of the positive crossover voltage and the negative crossover voltage as a temporary reference voltage if the difference between the positive crossover voltage and the negative crossover voltage is larger than or equal to the predetermined voltage; and
- (e) repeating steps (c) and (d) until the first analog signal and the second analog signal are free from voltage drift or noise interference and calculating an average of the temporary reference voltages as a reference voltage for the microcontroller.

21. An analog signal processing method according to claim 20, wherein the first analog signal and the second signal are sinusoidal signal.

22. An analog signal processing method according to claim 20, wherein the phase difference is 90 degrees.

23. An analog signal processing method according to claim 20, wherein the positive crossover voltage and the negative crossover voltage are obtained by a binary search.

24. An analog signal processing method for generating a reference voltage for a microcontroller, comprises the steps of:
- (a) providing a first analog signal and a second analog signal with a phase difference there between;
- (b) setting a sampling interval;
- (c) sampling the first analog signal and the second analog signal to obtain voltages of the first analog signal and the second analog signal at a first sampling point and voltages of the first analog signal and the second analog signal at a second sampling point;

(d) comparing the voltage of the first analog signal with that of the second analog signal at the first sampling point, and the voltage of the first analog signal with that of the second analog signal at the second sampling point;

(e) calculating an average of the first analog signal voltage and the second analog signal voltage at the first sampling point as a first crossover voltage of the first analog signal and the second analog signal if a comparison result of the first analog signal voltage with the second analog signal voltage at the first sampling point is different from that of the first analog signal voltage with the second analog signal voltage at the second sampling point;

(f) repeating steps (c) to (e) to obtain a second crossover voltage different from the first crossover voltage and calculating an average of the first crossover voltage and the second crossover voltage as a temporary reference voltage; and (g) repeating step (f) until the first analog signal and the second analog signal are free from errors due to voltage drift or noise interference, and calculating an average of the temporary reference voltages as a reference voltage of the microcontroller.

25. An analog signal processing method according to claim 24, wherein the first analog signal and the second signal are sinusoidal signal.

26. An analog signal processing method according to claim 24, wherein the phase difference is 90 degrees.

27. An analog signal processing method for generating a reference voltage for a microcontroller, comprises of the steps of:

(a) providing a first analog signal and a second analog signal with a phase difference there between;

(b) setting a sampling interval;

(c) sampling the first analog signal and the second analog signal to obtain voltages of the first analog signal and the second analog signal at a first sampling point and voltages of the first analog signal and the second analog signal at a second sampling point;

(d) comparing the voltage of the first analog signal with that of the second analog signal at the first sampling point, and the voltage of the first analog signal with that of the second analog signal at the second sampling point;

(e) calculating an average of the first analog signal voltage and the second analog signal voltage at the first sampling point as the first crossover voltage of the first analog signal and the second analog signal if a comparison result of the first analog signal voltage with the second analog signal voltage at the first sampling point is different from that of the first analog signal voltage with the second analog signal voltage at the second sampling point;

(f) repeating steps (c) to (e) to obtain a second crossover voltage which is different from the first crossover voltage and calculating an average of the first crossover voltage and the second crossover voltage as a temporary reference voltage; and (g) repeating step (f) until the first analog signal and a second analog signal are free from errors due to voltage drift or noise interference, and calculating an average of the temporary reference voltages as a reference voltage for the microcontroller.

28. An analog signal processing method according to claim 27, wherein the first and second signals are sinusoidal signals.

29. An analog signal processing method according to claim 27, wherein the phase difference is 90 degrees.

* * * * *